(12) United States Patent
Stockinger et al.

(10) Patent No.: US 7,777,998 B2
(45) Date of Patent: Aug. 17, 2010

(54) ELECTROSTATIC DISCHARGE CIRCUIT AND METHOD THEREFOR

(75) Inventors: Michael A. Stockinger, Austin, TX (US); Michael G. Khazhinsky, Austin, TX (US); James W. Miller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 402 days.

(21) Appl. No.: 11/852,396

(22) Filed: Sep. 10, 2007

(65) Prior Publication Data

US 2009/0067104 A1    Mar. 12, 2009

(51) Int. Cl.
*H02H 9/00*    (2006.01)

(52) U.S. Cl. .................. 361/56; 361/91.1; 361/111; 361/118

(58) Field of Classification Search ............. 361/56, 361/91.1, 111, 118; 257/355–360
See application file for complete search history.

(56) References Cited

U.S. PATENT DOCUMENTS

| | | | |
|---|---|---|---|
| 4,385,337 A | 5/1983 | Asano et al. | |
| 5,034,845 A | 7/1991 | Murakami | |
| 5,202,590 A | 4/1993 | Liepold et al. | |
| 5,237,395 A | 8/1993 | Lee | |
| 5,239,440 A | 8/1993 | Merrill | |
| 5,255,146 A | 10/1993 | Miller | |
| 5,287,241 A | 2/1994 | Puar | |
| 5,311,391 A | 5/1994 | Dungan et al. | |
| 5,361,185 A | 11/1994 | Yu | |
| 5,440,162 A | 8/1995 | Worley et al. | |
| 5,442,217 A * | 8/1995 | Mimoto | 257/361 |
| 5,477,414 A | 12/1995 | Li et al. | |
| 5,508,649 A | 4/1996 | Shay | |
| 5,515,232 A * | 5/1996 | Fukazawa et al. | 361/111 |
| 5,559,659 A | 9/1996 | Strauss | |
| 5,610,790 A | 3/1997 | Staab et al. | |
| 5,654,862 A | 8/1997 | Worley et al. | |
| 5,683,918 A | 11/1997 | Smith et al. | |
| 5,721,656 A | 2/1998 | Wu et al. | |
| 5,751,051 A | 5/1998 | Hayano | |

(Continued)

FOREIGN PATENT DOCUMENTS

EP    0026056 A1    4/1981

(Continued)

OTHER PUBLICATIONS

Final Rejection mailed Nov. 23, 2007 in Related U.S. Appl. No. 11/056,617.

(Continued)

*Primary Examiner*—Jared J Fureman
*Assistant Examiner*—Terrence R Willoughby
(74) *Attorney, Agent, or Firm*—Susan C. Hill

(57) ABSTRACT

Circuitry on integrated circuits usually includes protection against electrostatic discharge (ESD) events. A second ESD current path may be provided in addition to a first ESD current path for shunting ESD current away from circuitry to be protected during an ESD event. In addition to the standard power and ground buses used to provide power and ground voltages to the protected circuitry, one or more extra power and/or ground buses and associated circuitry may be added for improved ESD protection.

20 Claims, 3 Drawing Sheets

U.S. PATENT DOCUMENTS

| | | | |
|---|---|---|---|
| 5,773,326 | A | 6/1998 | Gilbert et al. |
| 5,821,804 | A * | 10/1998 | Nikutta et al. .............. 327/382 |
| 5,825,600 | A | 10/1998 | Watt |
| 5,907,464 | A | 5/1999 | Maloney et al. |
| 5,917,207 | A | 6/1999 | Colwell et al. |
| 5,946,177 | A | 8/1999 | Miller et al. |
| 5,991,134 | A | 11/1999 | Tan et al. |
| 6,002,156 | A | 12/1999 | Lin |
| 6,021,071 | A | 2/2000 | Otsuka |
| 6,075,686 | A | 6/2000 | Ker |
| 6,118,155 | A | 9/2000 | Voldman |
| 6,198,138 | B1 | 3/2001 | Hirota |
| 6,222,710 | B1 | 4/2001 | Yamaguchi |
| 6,268,286 | B1 | 7/2001 | Gauthier, Jr. et al. |
| 6,327,126 | B1 | 12/2001 | Miller et al. |
| 6,385,021 | B1 | 5/2002 | Takeda et al. |
| 6,400,540 | B1 | 6/2002 | Chang |
| 6,414,831 | B1 * | 7/2002 | Orchard-Webb ............ 361/111 |
| 6,552,372 | B2 | 4/2003 | Wu et al. |
| 6,576,958 | B2 | 6/2003 | Ker et al. |
| 6,717,270 | B1 | 4/2004 | Downey et al. |
| 6,724,603 | B2 | 4/2004 | Miller et al. |
| 6,867,461 | B1 | 3/2005 | Ker et al. |
| 6,879,476 | B2 | 4/2005 | Khazhinsky et al. |
| 6,900,970 | B2 | 5/2005 | Miller et al. |
| 6,970,336 | B2 | 11/2005 | Stockinger et al. |
| 7,209,332 | B2 | 4/2007 | Stockinger et al. |
| 7,233,466 | B2 * | 6/2007 | Yamaguchi .................. 361/56 |
| 7,236,339 | B2 | 6/2007 | Miller et al. |
| 2001/0017396 | A1 | 8/2001 | Miller, Jr. et al. |
| 2004/0027742 | A1 | 2/2004 | Miller et al. |
| 2004/0109270 | A1 | 6/2004 | Stockinger et al. |
| 2004/0141267 | A1 | 7/2004 | Khazhinsky et al. |
| 2004/0141268 | A1 | 7/2004 | Miller et al. |
| 2005/0018370 | A1 | 1/2005 | Arai et al. |
| 2005/0078419 | A1 | 4/2005 | Stockinger et al. |
| 2005/0185351 | A1 | 8/2005 | Miller et al. |
| 2006/0028776 | A1 | 2/2006 | Stockinger et al. |
| 2006/0154469 | A1 | 7/2006 | Hess et al. |
| 2006/0181823 | A1 | 8/2006 | Miller et al. |

FOREIGN PATENT DOCUMENTS

| | | |
|---|---|---|
| EP | 851552 A1 | 7/1998 |
| GB | 2286287 A | 8/1995 |
| WO | 0227795 A2 | 4/2002 |

OTHER PUBLICATIONS

Rejection mailed Jun. 13, 2007 in Related U.S. Appl. No. 11/056,617.

PCT/US05/45203 International Search Report and Written Opinion mailed Jul. 3, 2007 in PCT Application corresponding to Related U.S. Appl. No. 11/056,617.

PAB Decision mailed Mar. 19, 2008 in Related U.S. Appl. No. 11/056,617.

Final Rejection mailed Nov. 16, 2006 in Related U.S. Appl. No. 10/914,442.

Rejection mailed Jun. 5, 2006 in Related U.S. Appl. No. 10/914,442.

Notice of Allowance mailed May 14, 2009 in Related U.S. Appl. No. 11/513,638.

Rejection mailed Oct. 6, 2008 in Related U.S. Appl. No. 11/513,638.

PCT/US07/73679 International Search Report mailed Sep. 26, 2008 in PCT Application corresponding to Related U.S. Appl. No. 11/513,638.

Anderson, Warren R. et al.; "Cross-Referenced ESD Protection for Power Supplies"; EOS/ESD Symposium 98; pp. 2A.5.1 thru 2A.5.10.

Croft, Gregg D.; "Trasient Supply Clamp with a Variable RC Time Constant"; EOS/ESD Symposium 96; pp. 6.2.1-6.2.4.

Dabral, S. et al.; "Core Clamps for Low Voltage Technologies"; EOS/ESD Symposium 94; pp. 3.6.1-3.6.8.

Juliano, Patrick A. et al.; "ESD Protection Design Challenges for a High Pin-Count Alpha Microprocessor in a 0.13 um CMOS SOI Technology"; EOS/ESD Symposium; 2003; 11 Pgs; ESD Association.

Ker, Ming-Dou et al.;"ESD Protection Circuits with Novel MOS-Bounded Diode Structures"; 2002; pp. V-533 thru V-535; IEEE.

Khazhinsky, Michael G. et al.; "ESD Protection for Advanced CMOS SOI Technologies"; 10 Pgs.

Merrill, Richard et al.; "ESD Design Methodology"; EOS/ESD Symposium 93; pp. 5B.5.1-5B.5.5.

Miller, James. W. et al.; "Comprehensive ESD Protection for Flip-Chip Products in a Dual Gate Oxide 65nm CMOS Technology"; EOS/ESD Symposium 06; pp. 4A.4.1-4A.4.10.

Ramirez-Angulo, J. et al.; "Programmable BiCMOS Trasconductor for Capacitor-Transconductor Filters"; Electronics Letters; Jun. 18, 1992; No. 13; pp. 1105-1107; Stevenage, Herts, GB.

Stockinger, Michael et al.; "Boosted and Distributed Rail Clamp Networks for ESD Protection in Advanced CMOS Technologies"; 10 Pgs.

Torres, Cynthia S. et al.; "Modular, Portable, and Easily Simulated ESD Protection Networks for Advanced CMOS Technologies"; 14 Pgs.

Worley, E.R. et al.; "Sub-Micron Chip ESD Protection Schemes with Avoid Avalanching Junctions"; EOS/ESD Symposium 95; pp. 1.2.1-1.2.8.

* cited by examiner

ELECTROSTATIC DISCHARGE CIRCUIT AND METHOD THEREFOR

CROSS-REFERENCE TO RELATED APPLICATION(S)

This application is related to U.S. patent application Ser. No. 11/513,638, filed on Aug. 31, 2006, entitled "DISTRIBUTED ELECTROSTATIC DISCHARGE PROTECTION CIRCUIT WITH VARYING CLAMP SIZE," and assigned to the current assignee hereof.

This application is related to U.S. patent application Ser. No. 11/056,617, filed on Feb. 11, 2005, entitled "I/O CELL ESD SYSTEM," and assigned to the current assignee hereof.

This application is related to U.S. patent application Ser. No. 10/914,442, filed on Aug. 9, 2004, entitled "ELECTROSTATIC DISCHARGE PROTECTION FOR AN INTEGRATED CIRCUIT," and assigned to the current assignee hereof.

BACKGROUND

1. Field

This disclosure relates generally to circuits, and more specifically, to a circuit and method for reducing potential damage to an integrated circuit during an electrostatic discharge event.

2. Related Art

This disclosure relates generally to circuits, and more specifically, to a circuit and method for reducing potential damage to an integrated circuit during an electrostatic discharge event. An integrated circuit can be damaged when subjected to an overvoltage transient that is higher than the design voltage of the integrated circuit. Electrostatic discharge ("ESD"), originating from such sources as a mechanical chip carrier, a plastic chip storage device, or even a human being can generate a voltage that is many times greater than the design voltage of the integrated circuit. For example, the typical human body can supply an electrostatic discharge of 4 kilovolts or more. For integrated circuits that operate at voltages of less than, for example, 5V (volts), an electrostatic discharge of such proportions can be devastating. In order to protect the internal circuitry on integrated circuits from high voltage, or ESD events, protection circuits are utilized, generally between the internal circuitry and the input/output ("I/O") terminals (e.g. pads, pins, bumps, etc.) of the integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As semiconductor devices are becoming smaller and more fragile, the maximum ESD voltage that protected circuitry can withstand without incurring damage decreases. One way to handle this problem is to provide ESD protection circuitry that can reduce the voltage which must be handled by the increasingly fragile protected circuitry. Thus, it is desired to have ESD protection circuitry that reduces the voltage which must be handled by the increasingly fragile protected circuitry.

As used herein, the term "bus" refers to one or more conductors that deliver power (e.g. OVDD, OVSS) or other signals (e.g. TRIGGER) to multiple circuit elements. In some embodiments, one or more buses may be routed to all or a portion of the input/output (I/O) circuitry and to all or a portion of the ESD circuitry. In some embodiments, one or more buses may be routed overlying a plurality of integrated circuit pad cells, wherein the pad cells each comprise I/O circuitry and ESD circuitry associated with an I/O pad. As used herein, the terms "power supply node", "power bus" and "power supply conductor" may be used interchangeably.

Figure 1:
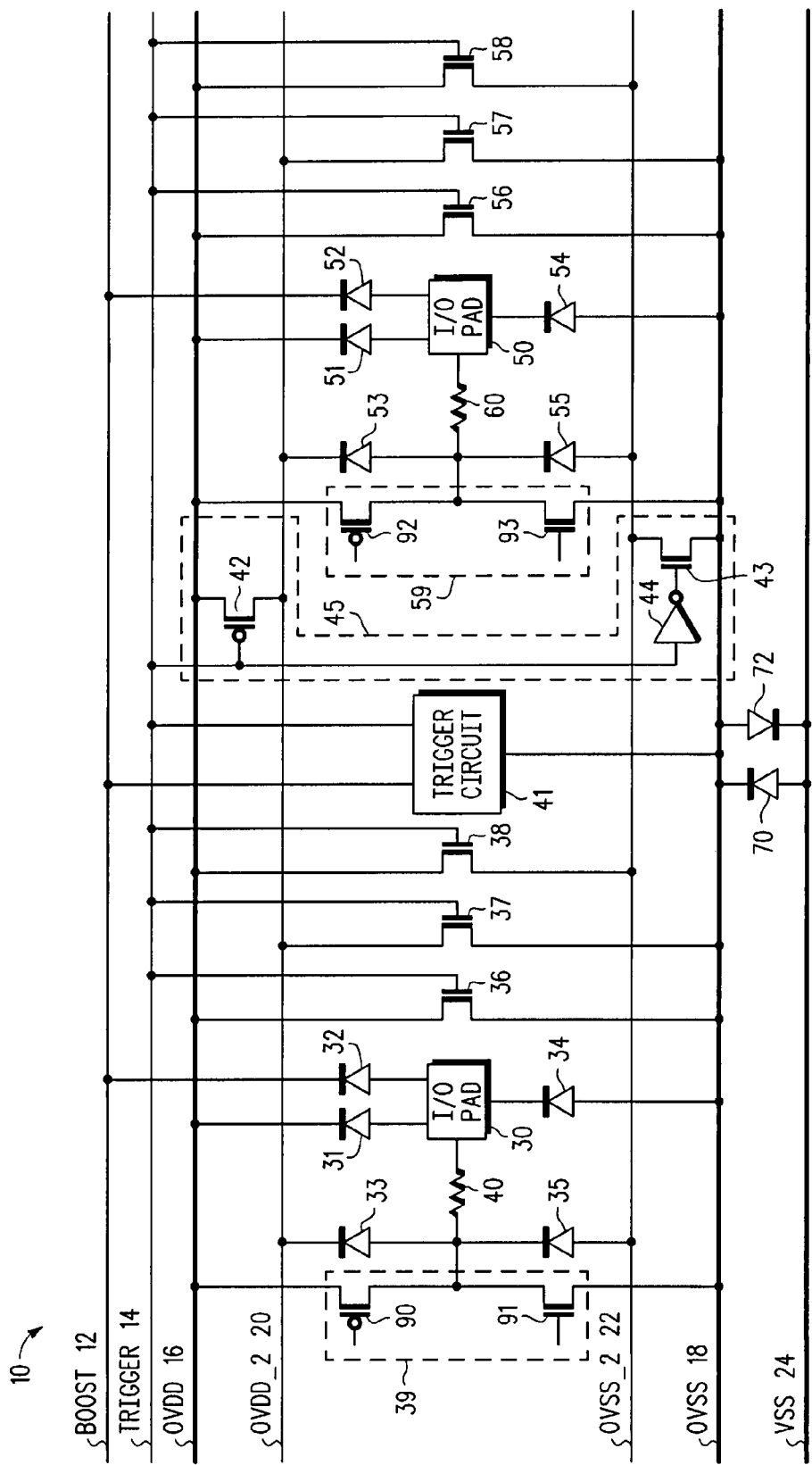
FIG. 1 illustrates, in partial schematic diagram form and partial block diagram form, a circuit in accordance with one embodiment of the present invention.

FIG. 1 illustrates a circuit 10 in accordance with one embodiment of the present invention. In the illustrated embodiment, circuit 10 comprises circuits 39 and 59 on an integrated circuit that are to be protected from ESD events. Although circuits 39 and 59 are illustrated as being output buffers comprising transistors 90, 91, 92, and 93, alternate embodiments may use any type of one or more circuits within the circuit 39 or 59 which are to be protected from ESD events. For example, in alternate embodiments, circuit 39 or 59 may be an input/output buffer, an input buffer, an analog circuit, or any desired type of circuit or combination of circuits.

In the illustrated embodiment, circuit 10 has a BOOST bus 12, a TRIGGER bus 14, a first power bus OVDD 16, a second power bus OVSS 18, a third power bus OVDD_2 20, a fourth power bus OVSS_2 22, and a fifth power bus VSS 24. In one embodiment, OVDD 16 and OVSS 18 are used to provide the primary power to circuit 10. In one embodiment, OVDD 16 provides a first power supply voltage and OVSS 18 provides a second power supply voltage that is less than the first power supply voltage. In some embodiments, the second power supply voltage equals approximately ground. In one embodiment, circuits 39 and 59 are coupled to OVDD 16 and to OVSS 18.

In the illustrated embodiment, circuit 39 comprises a p-channel MOSFET (metal oxide semiconductor field effect) transistor 90 having a first current electrode coupled to OVDD 16, having a second current electrode, and having a control electrode coupled to receive an input from other circuitry or devices (not shown). In the illustrated embodiment, circuit 39 also comprises an n-channel MOSFET transistor 91 having a first current electrode coupled to the second current electrode of transistor 90, having a second current electrode coupled to OVSS 18, and having a control electrode coupled to receive an input from other circuitry or devices (not shown).

In addition, circuit 10 has a diode 33 having a first current electrode coupled to OVDD_2 20, and having a second current electrode coupled to the second current electrode of transistor 90. Circuit 10 also has a diode 35 having a first current electrode coupled to the second current electrode of transistor 90, and having a second current electrode coupled to OVSS_2 22. A resistive element 40 has a first terminal coupled to the second current electrode of transistor 90, and has a second terminal coupled to I/O pad 30. Circuit 10 also has a diode 31 having a first current electrode coupled to OVDD 16, and having a second current electrode coupled to I/O pad 30. Circuit 10 also has a diode 32 having a first current electrode coupled to BOOST 12, and having a second current electrode coupled to I/O pad 30. Circuit 10 also has a diode 34 having a first current electrode coupled to I/O pad 30, and having a second current electrode coupled to OVSS 18.

Also, circuit 10 has an n-channel MOSFET transistor 36 having a first current electrode coupled to OVDD 16, having a second current electrode coupled to OVSS 18, and having a control electrode coupled to TRIGGER 14. Circuit 10 also has an n-channel MOSFET transistor 37 having a first current electrode coupled to OVDD_2 20, having a second current electrode coupled to OVSS 18, and having a control electrode coupled to TRIGGER 14. Circuit 10 also has an n-channel MOSFET transistor 38 having a first current electrode coupled to OVDD 16, having a second current electrode coupled to OVSS_2 22, and having a control electrode coupled to TRIGGER 14. Circuit 10 also has a trigger circuit 41 which is coupled to BOOST 12, to TRIGGER 14, and to OVSS 18.

In one embodiment, circuit 10 has an equalizer circuit 45. Alternate embodiments may use a different equalizer circuit or may not even use an equalizer circuit. In the illustrated embodiment, equalizer 45 has a p-channel MOSFET transistor 42 having a first current electrode coupled to OVDD 16, having a second current electrode coupled to OVDD_2 20, and having a control electrode coupled to TRIGGER 14. In the illustrated embodiment, equalizer 45 also has an inverter 44 having an input coupled to TRIGGER 14 and having an output. Equalizer 45 also has an n-channel MOSFET transistor 43 having a first current electrode coupled to OVSS_2 22, having a second current electrode coupled to OVSS 18, and having a control electrode coupled to the output of inverter 44.

In addition, circuit 10 has a diode 70 having a first current electrode coupled to OVSS 18, and having a second current electrode coupled to VSS 24. Also, circuit 10 has a diode 72 having a first current electrode coupled to OVSS 18, and having a second current electrode coupled to VSS 24. Alternate embodiments may not use diodes 70 and/or 72, or may use different circuitry instead of diodes 70 and/or 72.

In the illustrated embodiment, circuit 59 comprises a p-channel MOSFET transistor 92 having a first current electrode coupled to OVDD 16, having a second current electrode, and having a control electrode coupled to receive an input from other circuitry or devices (not shown) either on the same integrated circuit or from external to the integrated circuit. In the illustrated embodiment, circuit 59 also comprises an n-channel MOSFET transistor 93 having a first current electrode coupled to the second current electrode of transistor 92, having a second current electrode coupled to OVSS 18, and having a control electrode coupled to receive an input from other circuitry or devices (not shown) either on the same integrated circuit or from external to the integrated circuit.

In addition, circuit 10 has a diode 53 having a first current electrode coupled to OVDD_2 20, and having a second current electrode coupled to the second current electrode of transistor 92. Circuit 10 also has a diode 55 having a first current electrode coupled to the second current electrode of transistor 92, and having a second current electrode coupled to OVSS_2 22. A resistive element 60 has a first terminal coupled to the second current electrode of transistor 92, and has a second terminal coupled to I/O pad 50. Circuit 10 also has a diode 51 having a first current electrode coupled to OVDD 16, and having a second current electrode coupled to I/O pad 50. Circuit 10 also has a diode 52 having a first current electrode coupled to BOOST 12, and having a second current electrode coupled to I/O pad 50. Circuit 10 also has a diode 54 having a first current electrode coupled to I/O pad 50, and having a second current electrode coupled to OVSS 18.

Also, circuit 10 has an n-channel MOSFET transistor 56 having a first current electrode coupled to OVDD 16, having a second current electrode coupled to OVSS 18, and having a control electrode coupled to TRIGGER 14. Circuit 10 also has an n-channel MOSFET transistor 57 having a first current electrode coupled to OVDD_2 20, having a second current electrode coupled to OVSS 18, and having a control electrode coupled to TRIGGER 14. Circuit 10 also has an n-channel MOSFET transistor 58 having a first current electrode coupled to OVDD 16, having a second current electrode coupled to OVSS_2 22, and having a control electrode coupled to TRIGGER 14.

An example ESD event will now be described in order to discuss the functionality of circuit 10 of FIG. 1. During an ESD event occurring on I/O pads 30 and 50, where I/O pad 30 is at a higher potential than I/O pad 50, the ESD protection circuitry provides a low resistance path between I/O pads 30 and 50 so that circuits 39 and 59 are not damaged by the ESD event. During such an ESD event, the primary ESD current flows from I/O pad 30 through primary diode 31 to OVDD power bus 16, from OVDD power bus 16 through one or more primary rail clamps (e.g. 36, 56) to OVSS power bus 18, and from OVSS power bus 18 through primary diode 54 to I/O pad 50. Assuming that diodes 33 and 35 are not used and resistor 40 is replaced by a short, note that the ESD stress voltage on device 91 is approximately equal to the voltage across diode 31 and rail clamp 36. This ESD stress voltage on device 91 may exceed the maximum voltage that the device can withstand without incurring damage. Similarly, assuming that diodes 53 and 55 are not used and resistor 60 is replaced by a short, the ESD stress voltage on device 92 is approximately equal to the voltage across diode 54 and rail clamp 56. Likewise, this ESD stress voltage on device 92 may exceed the maximum voltage that the device can withstand without incurring damage.

In order to better protect devices contained within circuitry 39 and 59, a secondary ESD protection network or circuitry is added. In one embodiment, one or more additional power busses (e.g. OVDD_2 20, OVSS_2 22), and/or one or more rail clamps (e.g. 37, 38, 57, 58), and/or one or more secondary diodes (e.g. 33, 35, 53, 55), and/or one or more resistive elements (e.g. 40, 60) may be added to form this secondary ESD protection network. In the embodiment illustrated in FIG. 1, the primary ESD protection network or circuitry comprises power busses (e.g. OVDD 16, OVSS 18), and/or BOOST bus 12, and/or TRIGGER bus 14, and/or one or more rail clamps (e.g. 36, 56), and/or one or more primary diodes (e.g. 31, 34, 51, 54), and/or one or more boost diodes (e.g. 32, 52) and/or one or more trigger circuits (e.g. 41).

During the example ESD event described above, in one embodiment, the secondary ESD protection network provides a secondary ESD current path with an ESD current that may be lower than the ESD current of the primary ESD current path as provided by the primary ESD protection network. The secondary ESD protection network further reduces the voltage stress across devices 91 and 92. During such an ESD event, a first portion of the secondary ESD current used to further protect device 91 flows from I/O pad 30 through resistive element 40 and diode 33 to OVDD_2 power bus 20, from OVDD_2 power bus 20 through one or more secondary rail clamps (e.g. 37, 57) to OVSS power bus 18, from OVSS power bus 18 through diode 54 to I/O pad 50. In the illustrated embodiment, due in part to the resistance provided by resistive element 40, the current flowing through this secondary ESD path is lower than the current flowing through the primary ESD path. As a result, the voltage drop across secondary diode 33 and secondary clamp 37 is lower than the voltage drop across primary diode 31 and primary clamp 36. Note that for the illustrated embodiment, the voltage drop across secondary diode 33 and secondary clamp 37 is approximately equal to the ESD stress voltage on device 91 with the secondary ESD protection network being used. On the other hand, the voltage drop across primary diode 31 and primary clamp 36 is approximately equal to the ESD stress voltage on device 91 without the secondary ESD protection network being used. Thus in the illustrated embodiment, the voltage drop across resistive element 40 effectively reduces the ESD stress voltage on device 91. Note that increasing the size of elements 31, 36, and/or 56 may alternately be used to reduce the voltage across protected device 91; however, the semiconductor area required to do this may be prohibitively large. Thus, for many embodiments, the secondary ESD protection network provides an advantageous solution for improving ESD protection while using a minimum amount of additional semiconductor area.

During the same ESD event, a second portion of the secondary ESD current used to further protect device 92 flows from I/O pad 30 through diode 31 to OVDD power bus 16, from OVDD power bus 16 through one or more secondary rail clamps (e.g. 38, 58) to OVSS_2 power bus 22, from OVSS_2 power bus 22 through diode 55 and resistive element 60 to I/O pad 50. Due to the resistance provided by resistive element 60, the current flowing through this secondary ESD path is lower than the current flowing through the primary ESD path. As a result, the voltage drop across secondary diode 55 and secondary clamp 58 is lower than the voltage drop across primary diode 54 and primary clamp 56. Note that for the illustrated embodiment, the voltage drop across secondary diode 55 and secondary clamp 58 is approximately equal to the ESD stress voltage on device 92 with the secondary ESD protection network being used. On the other hand, the voltage drop across primary diode 54 and primary clamp 56 is approximately equal to the ESD stress voltage on device 92 without the secondary ESD protection network being used. Thus in the illustrated embodiment, the voltage drop across resistive element 60 effectively reduces the ESD stress voltage on device 92. Note that increasing the size of elements 54, 36, and/or 56 may alternately be used to reduce the voltage across protected device 92; however, the semiconductor area required to do this may be prohibitively large. Thus, for many embodiments, the secondary ESD protection network provides an advantageous solution for improving ESD protection while using a minimum amount of additional semiconductor area.

Note that in one embodiment where the protected circuitry 39 and 59 are output buffers, resistive elements 40 and 60 need to be low enough so that the performance (e.g. switching speed, drive strength) of the output buffers 39, 59 is not seriously impacted. For one embodiment, resistive elements 40 and 60 each have a resistive value in a range of approximately 1-20 ohms. In alternate embodiments where the protected circuitry 39 and 59 are input buffers, resistive elements 40 and 60 may each have a higher resistive value (e.g. in a range of approximately 10-1000 ohms) without seriously impacting the input buffer performance (e.g. switching speed). Yet other embodiments may use resistive elements 40 and 60 in a broader range of resistive values (e.g. in a range of approximately 1-1000 ohms). Other embodiments may use any desired and appropriate values for the one or more resistive elements. Note that using a higher resistance value for the resistive elements (e.g. 40 and 60) allows the secondary ESD protection network to provide a higher level of ESD protection using a given semiconductor area. Therefore, input buffers may particularly benefit from the addition of this secondary ESD protection network. However, the secondary ESD protection network may be helpful regardless of the type of circuit being protected (e.g. 39, 59) and regardless of the value of resistive elements 40, 60.

Note that the embodiment illustrated in FIG. 1 makes use of a boosted and distributed rail clamp network. The rail clamps used in the illustrated embodiment comprise NMOS transistors 36-38 and 56-58 that shunt ESD current between the power rails using normal NMOS channel conduction. For some embodiment, these NMOS transistors 36-38 and 56-58 are also known as "active NMOS" rail clamps. In the illustrated embodiment, the NMOS clamp transistors are made conductive during an ESD event by way of a trigger circuit 41. The trigger circuit 41 detects an ESD event by sensing either a predetermined voltage rise time or voltage threshold on the BOOST bus 12 appropriate to an ESD event, but not appropriate to normal operation of the integrated circuit. Alternate embodiments may detect an ESD event in any desired and appropriate manner.

After detection of an ESD event, the trigger circuit 41 then outputs a predetermined voltage (e.g. approximately equal to the voltage on BOOST bus 12) on the TRIGGER bus 14. In this embodiment, the TRIGGER bus 14 drives the control electrode of rail clamp devices 36-38 and 56-58, which allows the trigger circuit 41 to be located in any portion of the integrated circuit and does not require the trigger circuit 41 to be co-located with the rail clamps 36-38, and 56-58. In other embodiments, the functionality of the trigger circuit 41 may be combined with the functionality of selected rail clamps (e.g. 36-38, 56-58). For example, each I/O pad (e.g. 30, 50) may have its own trigger circuit 41 associated with the I/O pad. In yet other embodiments, the secondary rail clamps (37, 38, 57, 58) may have their own trigger circuit or circuits independent of the trigger circuit for the primary rail clamps (36, 56). By having separate trigger circuits for the primary and secondary rail clamps, it may be possible to improve the turn-on speed of the secondary clamps (i.e. the secondary clamps transition from a non-conducting state to a conducting state when an ESD event occurs). In one embodiment, the trigger circuit 41 may be a rise time detector. In alternate embodiments, the trigger circuit 41 may be any circuitry that can detect an ESD event and provide a control signal to turn on the rail clamps (36-38 and 56-58). In alternate embodiments, the rail clamps (36-38 and 56-58), illustrated in FIG. 1 as n-channel MOS transistors, may be implemented as p-channel MOS transistors. In yet other embodiments, the rail clamps can be implemented in other ways (e.g. lateral or vertical bipolar transistors or silicon controlled rectifiers, etc.) which may or may not require a trigger circuit to turn "on" during an ESD event (e.g. self-triggered snapback clamps).

While the primary rail clamp network is shown as having elements (e.g. 36, 56) distributed among the various I/O pads, alternate embodiments may use a different approach. For example, alternate embodiments may use one or more rail clamp devices not distributed among the I/O pads, but instead associated with one or more power supply pads or placed in other locations within the I/O region. Yet other embodiments may use one or more rail clamps (e.g. 36, 56) and locate them anywhere appropriate on the integrated circuit. While the secondary rail clamp network is shown as having elements (e.g. 37, 38, 57, 58) distributed among the various I/O pads, alternate embodiments may use a different approach. For example, alternate embodiments may use one or more rail clamp devices not distributed among the I/O pads, but instead associated with one or more power supply pads or placed in other locations within the I/O region. Yet other embodiments may use one or more rail clamps (e.g. 37, 38, 57, 58) and locate them anywhere appropriate on the integrated circuit.

In the embodiment illustrated in FIG. 1, boost circuitry comprises diodes 32 and 52 and the BOOST bus 12. This boost circuitry is used to provide a higher voltage to the control electrodes of the rail clamp devices (36-38 and 56-58) in order to allow the rail clamp devices to conduct as much current as possible. The higher voltage is provided to the trigger circuit 41 via BOOST bus 12. During the ESD event described above, the voltage on BOOST bus 12 is elevated via diode 32 to a voltage slightly less than the voltage of the "zapped" I/O pad 30. Note that in one embodiment, diode 32 is smaller than diode 31 as the BOOST bus 12 carries little current compared to the primary ESD current path. Alternate embodiments may not use boost circuitry, or may implement the boost circuitry in a different manner. For example, in an alternate embodiment, BOOST bus 12 may be merged with OVDD bus 16, and diodes 32, 52 may be deleted.

Note that although the functionality of circuit 10 has been described in the context of a particular ESD event, the secondary ESD protection circuitry may be useful for any type of ESD event occurring at any I/O pad (e.g. 30, 50). The secondary ESD protection circuitry may protect the circuitry associated with an I/O pad that experiences ESD current flowing into or out of the I/O pad. For example, an I/O pad may be protected even during a single pad ESD event (e.g. a charged device model (CDM) event).

In the embodiment illustrated in FIG. 1, the buses or conductors using the letters "VDD" are used during normal operation to provide a first power supply voltage (e.g. approximately a power supply voltage) to one or more circuit elements; and the buses or conductors using the letters "VSS" are used during normal operation to provide a second power supply voltage (e.g. approximately ground) to one or more circuit elements. OVDD power bus 16 and OVSS power bus 18 provide power to the protected circuitry 39 and 59 during normal circuit operation and conduct ESD current during an ESD event. In the illustrated embodiment, the VSS power bus 24 is coupled to the OVSS power bus 18 via diodes 70 and 72 to allow bidirectional ESD current flow between these two power buses. In one embodiment, the VSS power bus 24 may be coupled to the chip substrate and the OVSS power bus 18 may be used for a segment of one or more I/O pads. A second OVSS power bus used for a second segment of one or more I/O pads (not shown) may be electrically isolated from the OVSS power bus 18 to avoid noise coupling between the two segments. During an ESD event in which a potential difference is applied between the two segments, the VSS power bus 24 provides a primary ESD current path between the two segments via diodes 70 and 72. Likewise, for any given number of I/O pad segments, the VSS power bus 24 provides a common ESD current exchange rail between any of the I/O segments. Alternate embodiments may partition the OVSS power bus 18 in any desired manner.

During normal operation of the illustrated embodiment in FIG. 1, when OVDD power bus 16 is powered up to its nominal supply voltage with respect to OVSS power bus 18 and when no ESD stress is applied, the secondary power bus OVDD_2 20 is actively coupled to the primary power bus OVDD 16 by device 42 so that the potential difference between the two power buses is kept low. This is done to avoid drifting of the voltage on OVDD_2 power bus 20, which may cause parasitic noise coupling between I/O pads (e.g. 30 and 50) or variations in I/O leakage current through the secondary diodes (e.g. 33, 53). In one embodiment, device 42 may be a PMOS transistor with its control terminal coupled to TRIGGER bus 14. Likewise, the secondary power bus OVSS_2 22 is actively coupled to the primary power bus OVSS 18 by device 43 during normal operation so that the potential difference between the two power buses is kept low. This is done to avoid drifting of the voltage on OVSS_2 power bus 22, which may cause parasitic noise coupling between I/O pads (e.g. 30 and 50) or variations in I/O leakage current through the secondary diodes (e.g. 35, 55). In one embodiment, device 43 may be an NMOS transistor with its control terminal coupled to TRIGGER bus 14 via an inverter 44. In the illustrated embodiment, circuitry 45 thus operates as an equalizer circuit.

Figure 2:
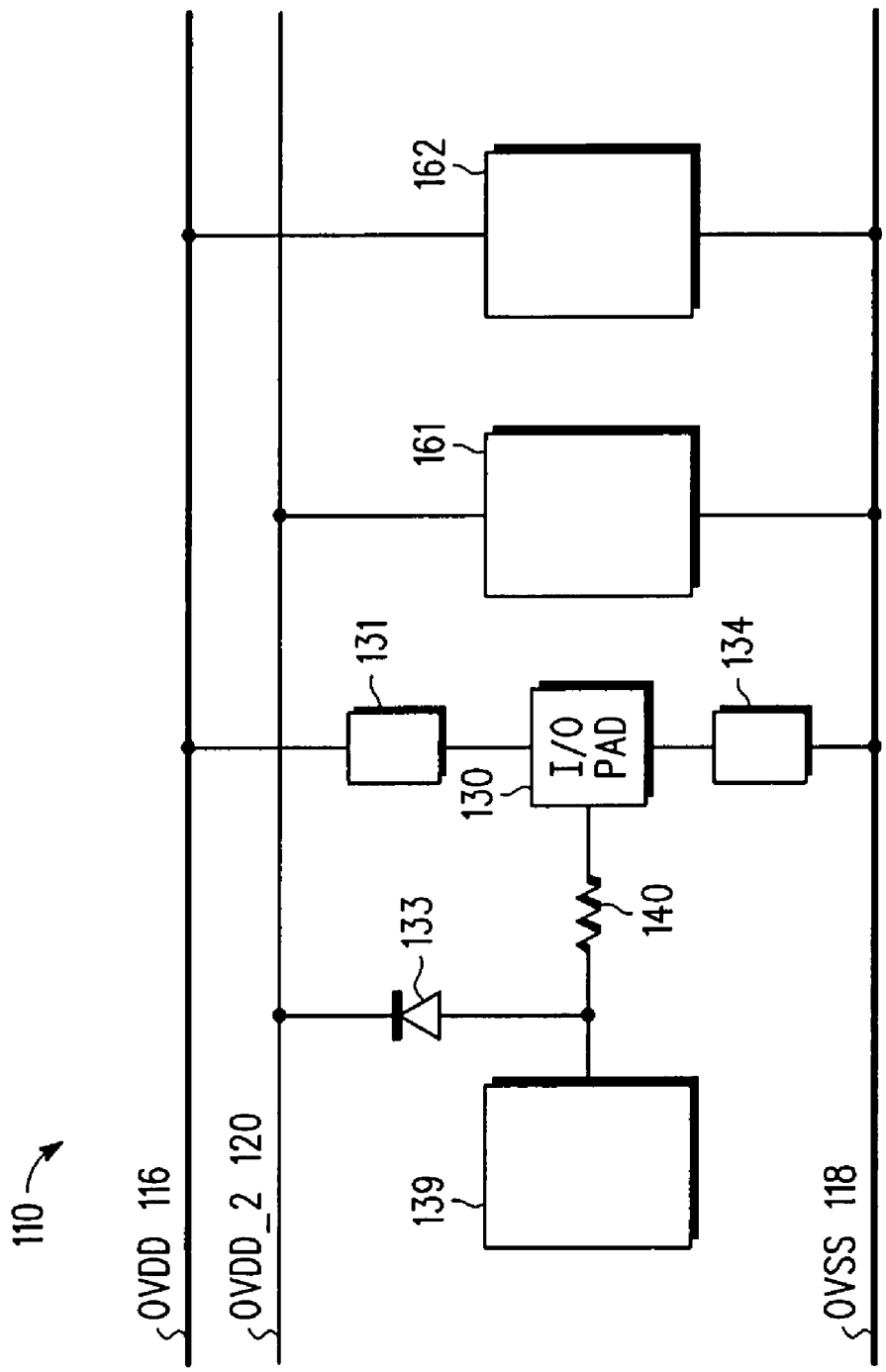
FIG. 2 illustrates, in partial schematic diagram form and partial block diagram form, a circuit in accordance with another embodiment of the present invention.

FIG. 2 illustrates a circuit 110 in accordance with an alternate embodiment of the present invention. In the illustrated embodiment, circuit 110 comprises a circuit 139 that is to be protected from ESD events. Alternate embodiments may use any type of one or more circuits within the circuit 139 which are to be protected from ESD events. For example, in alternate embodiments, circuit 139 may be an input buffer, an output buffer, an input/output buffer, an analog circuit, or any desired type of circuit or combination of circuits.

In the illustrated embodiment, circuit 110 has a first power bus OVDD 116, a second power bus OVSS 118, and a third power bus OVDD_2 120. In one embodiment, OVDD 116 and OVSS 118 are used to provide the primary power to circuit 110. In one embodiment, OVDD 116 provides a first power supply voltage and OVSS 118 provides a second power supply voltage that is less than the first power supply voltage. In some embodiments, the second power supply voltage equals approximately ground. In one embodiment, circuit 139 is coupled to OVDD 116 and to OVSS 118 in order to receive power for normal operation.

In one embodiment, circuit 110 has a diode 133 having a first current electrode coupled to OVDD_2 120, and having a second current electrode coupled to circuit 139. A resistive element 140 has a first terminal coupled to the second current electrode of diode 133, and has a second terminal coupled to I/O pad 130. I/O pad 130 is coupled to OVDD 116 by way of circuitry 131, and is coupled to OVSS 118 by way of circuitry 134. In one embodiment, circuitry 131 may be implemented in the same manner as in FIG. 1 (e.g. by using one or more diodes such as diode 31). In one embodiment, circuitry 134 may be implemented in the same manner as in FIG. 1 (e.g. by using one or more diodes such as diode 34). Alternate embodiments may use any desired and appropriate circuitry to implement circuitry 131 and 134.

Circuit 110 also has circuitry 162 coupled between OVDD 116 and OVSS 118 to function as a primary rail clamp and to be part of a primary ESD current path during an ESD event. Circuit 110 also has circuitry 161 coupled between OVDD_2 120 and OVSS 118 to function as a secondary rail clamp and to be part of a secondary ESD current path during an ESD event. This secondary ESD current path through circuitry 161 is used in addition to the primary ESD current path through circuitry 162. In one embodiment, circuitry 162 may be implemented in the same manner as in FIG. 1 (e.g. by using one or more clamps such as transistor 36). In one embodiment, circuitry 161 may be implemented in the same manner as in FIG. 1 (e.g. by using one or more clamps such as transistors 37, 57). Alternate embodiments may use any desired and appropriate circuitry to implement circuitry 161 and 162.

In addition, in various alternate embodiments, circuit 110 may use a BOOST bus 12 as in FIG. 1, may use a TRIGGER bus 14 as in FIG. 1, may use another ground bus (e.g. VSS 24) as in FIG. 1, may use yet another ground bus (e.g. OVSS_2 22) may use a trigger circuit 41 as in FIG. 1, may use an equalizer circuit 45 as in FIG. 1, may use cross-coupled diodes (e.g. 70, 72) as in FIG. 1, and may use a wide variety of different circuitry that provides a secondary ESD current path to reduce the risk of damaging a protected circuit such as circuit 139.

In one embodiment, the elements illustrated in FIG. 2 operate in a very similar manner to the elements illustrated in FIG. 1. One purpose of FIG. 2 is to highlight the use of the secondary ESD protection network or circuitry comprised of resistive element 140, diode 133, OVDD_2 bus 120, and secondary rail clamp 161. During an ESD event where current is flowing into I/O pad 130 and to OVSS bus 118, this secondary ESD circuitry reduces the voltage stress on protected circuitry 139. Note that, unlike FIG. 1, in this embodiment only one secondary power rail OVDD_2 120 is used in addition to the primary power rails OVDD 116 and OVSS 118. The primary ESD current path in the ESD event described above is through elements 131, 116, and 162. The secondary ESD current is through elements 140, 133, 120, and 161. Note that ESD protection elements 131 and 134 can be implemented in a variety of ways. In one embodiment, elements 131 and 134 may be diodes as illustrated in FIG. 1. In an alternate embodiment, elements 131 and/or 134 may be local ESD clamps (e.g. MOS transistors, lateral or vertical bipolar transistors, silicon controlled rectifiers, etc.) that provide direct ESD protection to OVDD power bus 116 and OVSS power bus 118, respectively. In other embodiments, only one of the two elements 131 and 134 may be present in circuit 110, providing bidirectional ESD protection to OVDD power bus 116 (in the case only element 131 is present) or OVSS power bus 118 (in the case only element 134 is present), respectively.

Figure 3:
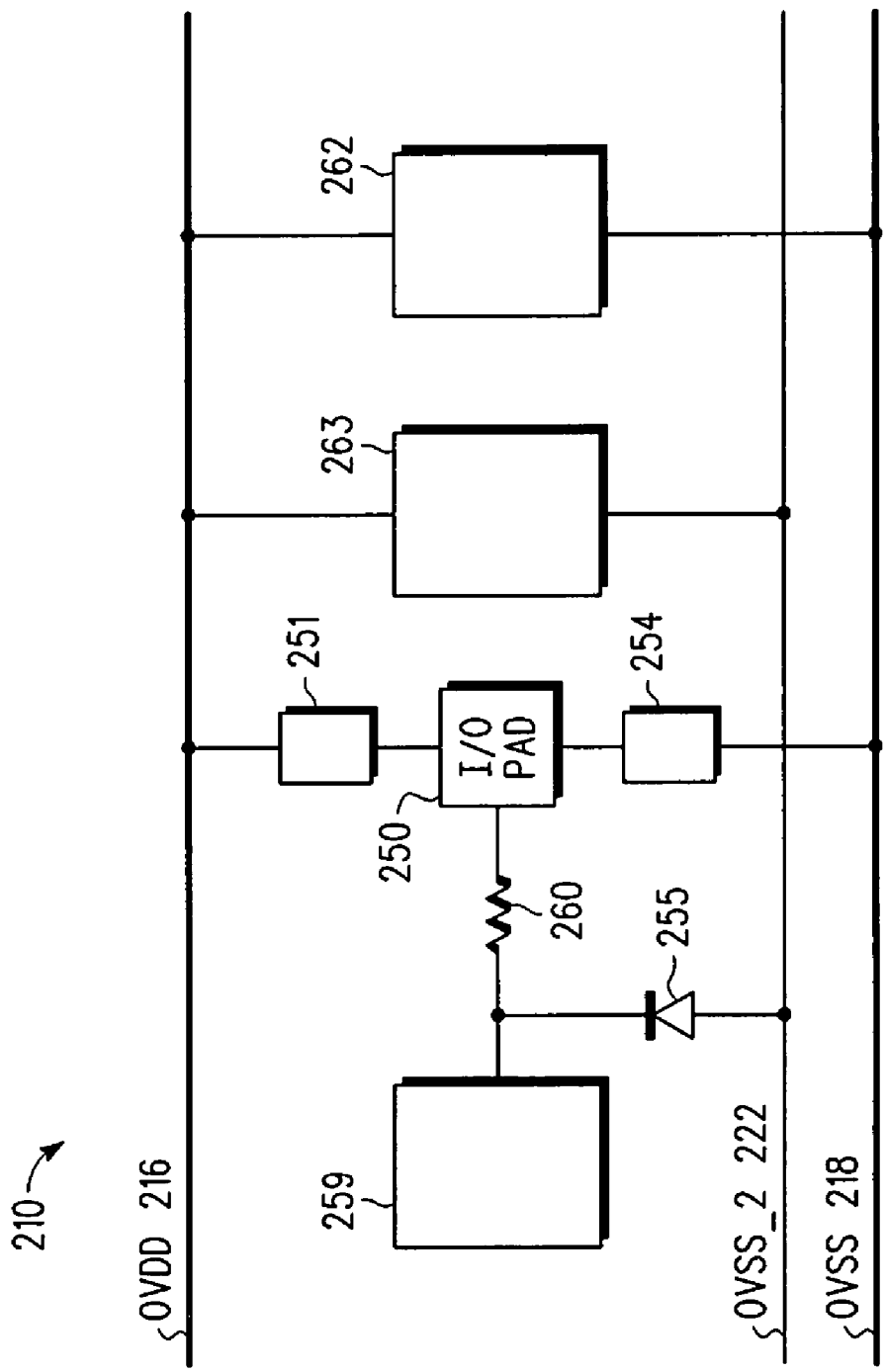
FIG. 3 illustrates, in partial schematic diagram form and partial block diagram form, a circuit in accordance with an alternate embodiment of the present invention.

FIG. 3 illustrates a circuit 210 in accordance with an alternate embodiment of the present invention. In the illustrated embodiment, circuit 210 comprises a circuit 259 that is to be protected from ESD events. Alternate embodiments may use any type of one or more circuits within the circuit 259 which are to be protected from ESD events. For example, in alternate embodiments, circuit 259 may be an input buffer, an output buffer, an input/output buffer, an analog circuit, or any desired type of circuit or combination of circuits.

In the illustrated embodiment, circuit 210 has a first power bus OVDD 216, a second power bus OVSS 218, and a third power bus OVSS_2 222. In one embodiment, OVDD 216 and OVSS 218 are used to provide the primary power to circuit 210. In one embodiment, OVDD 216 provides a first power supply voltage and OVSS 218 provides a second power supply voltage that is less than the first power supply voltage. In some embodiments, the second power supply voltage equals approximately ground. In one embodiment, circuit 259 is coupled to OVDD 216 and to OVSS 218 in order to receive power for normal operation.

In one embodiment, circuit 210 has a diode 255 having a first current electrode coupled to circuit 259, and having a second current electrode coupled to OVSS_2 222. A resistive element 260 has a first terminal coupled to the first current electrode of diode 255, and has a second terminal coupled to I/O pad 250. I/O pad 250 is coupled to OVDD 216 by way of circuitry 251, and is coupled to OVSS 218 by way of circuitry 254. In one embodiment, circuitry 251 may be implemented in the same manner as in FIG. 1 (e.g. by using one or more diodes such as diode 51). In one embodiment, circuitry 254 may be implemented in the same manner as in FIG. 1 (e.g. by using one or more diodes such as diode 54). Alternate embodiments may use any desired and appropriate circuitry to implement circuitry 251 and 254.

Circuit 210 also has circuitry 262 coupled between OVDD 216 and OVSS 218 to function as a primary rail clamp and to be part of a primary ESD current path during an ESD event. Circuit 210 also has circuitry 263 coupled between OVDD 216 and OVSS_2 222 to function as a secondary rail clamp and to be part of a secondary ESD current path during an ESD event. This secondary ESD current path through circuitry 263 is used in addition to the primary ESD current path through circuitry 262. In one embodiment, circuitry 262 may be implemented in the same manner as in FIG. 1 (e.g. by using one or more clamps such as transistor 56). In one embodiment, circuitry 263 may be implemented in the same manner as in FIG. 1 (e.g. by using one or more clamps such as transistors 38, 58). Alternate embodiments may use any desired and appropriate circuitry to implement circuitry 263 and 262.

In addition, in various alternate embodiments, circuit 210 may use a BOOST bus 12 as in FIG. 1, may use a TRIGGER bus 14 as in FIG. 1, may use another ground bus (e.g. VSS 24) as in FIG. 1, may use another power bus (e.g. OVDD_2 20), may use a trigger circuit 41 as in FIG. 1, may use an equalizer circuit 45 as in FIG. 1, may use cross-coupled diodes (e.g. 70, 72) as in FIG. 1, and may use a wide variety of different circuitry that provides a secondary ESD current path to reduce the risk of damaging a protected circuit such as circuit 259.

In one embodiment, the elements illustrated in FIG. 3 operate in a very similar manner to the elements illustrated in FIG. 1. One purpose of FIG. 3 is to highlight the use of the secondary ESD protection network or circuitry comprised of resistive element 260, diode 255, OVSS_2 bus 222, and secondary rail clamp 263. During an ESD event where current is flowing out of I/O pad 250 coming from OVDD bus 216, this secondary ESD circuitry reduces the voltage stress on protected circuitry 259. Note that, unlike FIG. 1, in this embodiment only one secondary power rail OVSS_2 222 is used in addition to the primary power rails OVDD 216 and OVSS 218. The primary ESD current path in the ESD event described above is through elements 254, 218, and 262. The secondary ESD current is through elements 260, 255, 222, and 263. Note that ESD protection elements 251 and 254 can be implemented in a variety of ways. In one embodiment, elements 251 and 254 may be diodes as illustrated in FIG. 1. In an alternate embodiment, elements 251 and/or 254 may be local ESD clamps (e.g. MOS transistors, lateral or vertical bipolar transistors, silicon controlled rectifiers, etc.) that provide direct ESD protection to OVDD power bus 216 and OVSS power bus 218, respectively. In other embodiments, only one of the two elements 251 and 254 may be present in circuit 210, providing bidirectional ESD protection to OVDD power bus 216 (in the case only element 251 is present) or OVSS power bus 218 (in the case only element 254 is present), respectively.

Referring to FIG. 1, note that any number of transistors 36, 56 may be used to form a primary rail clamp. In one embodiment, each I/O pad (e.g. 30, 50) may have one rail clamp associated with it. In alternate embodiments, each I/O pad (e.g. 30, 50) may have any number of rail clamps associated with it. Although the embodiments illustrated in FIGS. 1-3 shown both a primary ESD current path and a secondary ESD current path between power and ground, alternate embodiments may have any number of ESD current paths between power and ground. Note that FIG. 1 illustrates an embodiment that uses both a secondary VDD power bus or rail (OVDD_2 20) as well as a secondary VSS power bus or rail (OVSS_2 22). In this embodiment, the primary VDD power bus or rail is OVDD 16 and the primary VSS or ground power bus or rail is OVSS 18. FIG. 2, on the other hand, illustrates an embodiment that uses a secondary VDD power bus or rail (OVDD_2 120) and no secondary VSS power bus or rail. In the embodiment of FIG. 2, the primary VDD power bus or rail is OVDD 116 and the primary VSS or ground bus or rail is OVSS 118. FIG. 3 illustrates an embodiment that uses a secondary VSS power bus or rail (OVSS_2 222) and no secondary VDD power bus or rail. In the embodiment of FIG. 3, the primary VDD power bus or rail is OVDD 216 and the primary VSS or ground bus or rail is OVSS 218.

By now it should be appreciated that there has been provided circuitry that can provide a plurality of ESD current paths in order to better protect circuitry on an integrated circuit from potentially damaging ESD events Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments. In addition, one or more of circuits 10, 110, 210 or other embodiments of circuitry used to provide ESD protection may be used on one or more integrated circuits. These integrated circuits may be incorporated into a wide variety of apparatus, such as, for example, electronic equipment (e.g. cell phones, computers, etc.), products using electronic control (e.g. vehicles, appliances, etc.), or any apparatus at all that makes use of an integrated circuit.

Although the invention is described herein with reference to specific embodiments, various modifications and changes can be made without departing from the scope of the present invention as set forth in the claims below. For example, I/O pads 30, 130, and 250 do not have to be implemented as pads, but may be any portion of an integrated circuit that is susceptible to receiving the stress of an ESD event. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Additional Text

1. An apparatus comprising an integrated circuit, the integrated circuit comprising:
    a pad for example: (250, 130, 50 or 30) for communicating external to the integrated circuit;
    a first ESD protection element for example: (254, 131, 54 or 31) which couples the pad to a first power supply node for example: (218, 116, 18 or 16) in response to an ESD event;
    a second ESD protection element for example: (262, 162, 56 or 36) which couples the first power supply node to a second power supply node for example: (216, 118, 16 or 18) in response to the ESD event;
    a resistive element for example: (260, 140, 60 or 40) having a first terminal coupled to the pad and having a second terminal;
    a first diode for example: (255, 133, 55 or 33) having a first terminal coupled to the second terminal of the resistive element and having a second terminal coupled to a third power supply node for example: (222, 120, 22 or 20); and
    a third ESD protection element for example: (263, 161, 58 or 37) which couples the third power supply node to the second power supply node in response to the ESD event, wherein the first power supply node, the second power supply node, and the third power supply node are different nodes.

2. An apparatus as in statement 1, wherein the first ESD protection element comprises a diode.

3. An apparatus as in statement 1, wherein the second ESD protection element comprises a transistor.

4. An apparatus as in statement 1, wherein the third ESD protection element comprises a transistor.

5. An apparatus as in statement 1, wherein the third power supply node and the first power supply node are both at approximately a first voltage during normal operation of the integrated circuit.

6. An apparatus as in statement 1, wherein the third power supply node and the first power supply node are both at approximately VSS (ground) during normal operation of the integrated circuit.

7. An apparatus as in statement 1, wherein the third power supply node and the first power supply node are both at approximately VDD (power) during normal operation of the integrated circuit.

8. An apparatus as in statement 1, wherein the integrated circuit further comprises protected circuitry for example: (259, 139, 59 or 39) coupled to the second terminal of the resistive element.

9. An apparatus as in statement 8, wherein the protected circuitry comprises a buffer coupled to the first power supply node and coupled to the second power supply node.

10. An apparatus as in statement 9, wherein the buffer comprises at least one of an input buffer and an output buffer.

11. An apparatus as in statement 1, further comprising:
a fourth ESD protection element for example: (51 or 34) which couples the pad to the second power supply node in response to the ESD event.

12. An apparatus as in statement 11, further comprising:
a second diode for example: (53 or 35) having a first terminal coupled to the second terminal of the resistive element and having a second terminal coupled to a fourth power supply node for example: (20 or 22).

13. An apparatus as in statement 12, further comprising:
a fifth ESD protection element for example: (57 or 38) which couples the fourth power supply node to the first power supply node in response to the ESD event.

14. An apparatus as in statement 12, wherein the third power supply node and the first power supply node are both at approximately a first voltage during normal operation of the integrated circuit, wherein the fourth power supply node and the second power supply node are both at approximately a second voltage during normal operation of the integrated circuit, and wherein the second voltage is substantially different than the first voltage.

15. An apparatus as in statement 1, further comprising:
a trigger circuit for example: (41), coupled to detect the ESD event and to trigger both the first ESD protection element and the second ESD protection element in response to detecting the ESD event.

16. An apparatus as in statement 15, further comprising:
a boost bus for example: (12), coupled to the trigger circuit, wherein the trigger circuit detects the ESD event by monitoring voltage on the boost bus.

17. An apparatus comprising an integrated circuit, the integrated circuit comprising:
a pad for example: (250, 130, 50 or 30) for communicating external to the integrated circuit;
a first diode for example: (254, 131, 54 or 31) which couples the pad to a first power supply node for example: (218, 116, 18 or 16) in response to an ESD event;
a first transistor for example: (262, 162, 56 or 36) which couples the first power supply node to a second power supply node for example: (216, 118, 16 or 18) in response to the ESD event;
a resistive element for example: (260, 140, 60 or 40) having a first terminal coupled to the pad and having a second terminal;
a second diode for example: (255, 133, 55 or 33) having a first terminal coupled to the second terminal of the resistive element and having a second terminal coupled to a third power supply node for example: (222, 120, 22 or 20); and
a second transistor for example: (263, 161, 58 or 37) which couples the third power supply node to the second power supply node in response to the ESD event,
wherein the first power supply node, the second power supply node, and the third power supply node are different nodes.

18. A method, comprising:
providing protected circuitry for example: (259, 139, 59 or 39) on an integrated circuit, wherein the protected circuitry is to be protected from an ESD event;
providing a first power conductor for example: (218, 116, 18 or 16) for providing a first power voltage to the protected circuitry;
providing a second power conductor for example: (216, 118, 16 or 18) for providing a second power voltage to the protected circuitry;
wherein the first power voltage and the second power voltage are substantially different during normal operation of the protected circuitry;
using the first power conductor and the second power conductor in a first ESD current path for example: (250/254/218/262/216, 130/131/116/162/118, 50/54/18/56/16 or 30/31/16/36/18) for conducting a first portion of ESD current due to the ESD event;
providing a third power conductor for example: (222, 120, 22 or 20) which provides no power to the protected circuitry; and
using the third power conductor in a second ESD current path for example: (250/260/255/222/263/216, 130/140/133/120/161/118, 50/60/55/22/58/16 or 30/40/33/20/37/18) for conducting a second portion of the ESD current due to the ESD event,
wherein the first ESD current path is not identical to the second ESD current path, and
wherein the third power conductor is held to approximately a same voltage as one of the first power conductor or the second power conductor during normal operation of the protected circuitry.

19. A method as in statement 18, further comprising:
providing a trigger circuit for example: (41) to enable the first and second ESD current paths to be conductive during the ESD event and to enable the first and second ESD current paths to be non-conductive during normal operation of the protected circuitry.

20. A method as in statement 18, further comprising:
providing an equalizer circuit for example: (45) for decoupling the first power conductor and the third power conductor in response to the ESD event, and for coupling the first power conductor and the third power conductor during normal operation of the protected circuitry.

The invention claimed is:

1. An apparatus comprising an integrated circuit, the integrated circuit comprising:
a pad for communicating external to the integrated circuit;
a first ESD protection element which couples the pad to a first power supply node in response to an ESD event;
a second ESD protection element which couples the first power supply node to a second power supply node in response to the ESD event;
a resistive element having a first terminal coupled to the pad and having a second terminal;
a first diode having a first terminal coupled to the second terminal of the resistive element and having a second terminal coupled to a third power supply node; and
a third ESD protection element which couples the third power supply node to the second power supply node in response to the ESD event,
wherein the first power supply node, the second power supply node, and the third power supply node are different nodes.

2. An apparatus as in claim 1, wherein the first ESD protection element comprises a diode.

3. An apparatus as in claim 1, wherein the second ESD protection element comprises a transistor.

4. An apparatus as in claim 1, wherein the third ESD protection element comprises a transistor.

5. An apparatus as in claim 1, wherein the third power supply node and the first power supply node are both at approximately a first voltage during normal operation of the integrated circuit.

6. An apparatus as in claim 1, wherein the third power supply node and the first power supply node are both at approximately VSS (ground) during normal operation of the integrated circuit.

7. An apparatus as in claim 1, wherein the third power supply node and the first power supply node are both at approximately VDD (power) during normal operation of the integrated circuit.

8. An apparatus as in claim 1, wherein the integrated circuit further comprises protected circuitry coupled to the second terminal of the resistive element.

9. An apparatus as in claim 8, wherein the protected circuitry comprises a buffer coupled to the first power supply node and coupled to the second power supply node.

10. An apparatus as in claim 9, wherein the buffer comprises at least one of an input buffer and an output buffer.

11. An apparatus as in claim 1, further comprising:
a fourth ESD protection element which couples the pad to the second power supply node in response to the ESD event.

12. An apparatus as in claim 11, further comprising:
a second diode having a first terminal coupled to the second terminal of the resistive element and having a second terminal coupled to a fourth power supply node.

13. An apparatus as in claim 12, further comprising:
a fifth ESD protection element which couples the fourth power supply node to the first power supply node in response to the ESD event.

14. An apparatus as in claim 12, wherein the third power supply node and the first power supply node are both at approximately a first voltage during normal operation of the integrated circuit, wherein the fourth power supply node and the second power supply node are both at approximately a second voltage during normal operation of the integrated circuit, and wherein the second voltage is substantially different than the first voltage.

15. An apparatus as in claim 1, further comprising:
a trigger circuit, coupled to detect the ESD event and to trigger both the first ESD protection element and the second ESD protection element in response to detecting the ESD event.

16. An apparatus as in claim 15, further comprising:
a boost bus, coupled to the trigger circuit, wherein the trigger circuit detects the ESD event by monitoring voltage on the boost bus.

17. An apparatus comprising an integrated circuit, the integrated circuit comprising:
a pad for communicating external to the integrated circuit;
a first diode which couples the pad to a first power supply node in response to an ESD event;
a first transistor which couples the first power supply node to a second power supply node in response to the ESD event;
a resistive element having a first terminal coupled to the pad and having a second terminal;
a second diode having a first terminal coupled to the second terminal of the resistive element and having a second terminal coupled to a third power supply node; and
a second transistor which couples the third power supply node to the second power supply node in response to the ESD event,
wherein the first power supply node, the second power supply node, and the third power supply node are different nodes.

18. A method, comprising:
providing protected circuitry on an integrated circuit, wherein the protected circuitry is to be protected from an ESD event;
providing a first power conductor for providing a first power voltage to the protected circuitry;
providing a second power conductor for providing a second power voltage to the protected circuitry;
wherein the first power voltage and the second power voltage are substantially different during normal operation of the protected circuitry;
using the first power conductor and the second power conductor in a first ESD current path for conducting a first portion of ESD current due to the ESD event;
providing a third power conductor which provides no power to the protected circuitry; and
using the third power conductor in a second ESD current path for conducting a second portion of the ESD current due to the ESD event,
wherein the first ESD current path is not identical to the second ESD current path, and
wherein the third power conductor is held to approximately a same voltage as one of the first power conductor or the second power conductor during normal operation of the protected circuitry.

19. A method as in claim 18, further comprising:
providing a trigger circuit to enable the first and second ESD current paths to be conductive during the ESD event and to enable the first and second ESD current paths to be non-conductive during normal operation of the protected circuitry.

20. A method as in claim 18, further comprising:
providing an equalizer circuit for decoupling the first power conductor and the third power conductor in response to the ESD event, and for coupling the first power conductor and the third power conductor during normal operation of the protected circuitry.

* * * * *